(12) United States Patent  
Harris et al.

(10) Patent No.: US 6,836,135 B2
(45) Date of Patent: Dec. 28, 2004

(54) OPTICAL TESTING DEVICE

(75) Inventors: Daniel L. Harris, Beaverton, OR (US);
Peter R. McCann, Beaverton, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 203 days.

(21) Appl. No.: 10/214,888

(22) Filed: Aug. 7, 2002

(65) Prior Publication Data

US 2003/0042889 A1 Mar. 6, 2003

Related U.S. Application Data

(60) Provisional application No. 60/316,644, filed on Aug. 31, 2001.

(51) Int. Cl.[7] .................................................. G01R 31/02
(52) U.S. Cl. ........................ 324/765; 158/754; 158/758
(58) Field of Search ................................. 324/765, 754, 324/158.1, 758, 761, 751, 752, 753, 501; 356/479, 497, 503; 359/497

(56) References Cited

U.S. PATENT DOCUMENTS

| 4,727,637 | A | | 3/1988 | Buckwitz et al. |
| 5,202,558 | A | | 4/1993 | Barker |
| 5,408,189 | A | | 4/1995 | Swart et al. |
| 5,515,167 | A | * | 5/1996 | Ledger et al. ............... 356/505 |
| 5,611,946 | A | | 3/1997 | Leong et al. ............ 219/121.6 |
| 5,666,063 | A | | 9/1997 | Abercrombie et al. |
| 5,804,982 | A | | 9/1998 | Lo et al. |
| 5,831,442 | A | | 11/1998 | Heigl |
| 5,900,737 | A | | 5/1999 | Graham et al. |
| 5,945,836 | A | | 8/1999 | Sayre et al. |
| 6,031,383 | A | | 2/2000 | Streib et al. |
| 6,271,673 | B1 | | 8/2001 | Furuta et al. |
| 6,335,628 | B2 | | 1/2002 | Schwindt et al. ........... 324/754 |
| 6,624,891 | B2 | * | 9/2003 | Marcus et al. ............... 356/479 |

* cited by examiner

*Primary Examiner*—Evan Pert
*Assistant Examiner*—Jimmy Nguyen
(74) *Attorney, Agent, or Firm*—Chernoff Vilhauer McClung & Stenzel, LLP

(57) ABSTRACT

A chuck adapted to test electrical and/or optical components on a device-under-test (DUT).

24 Claims, 6 Drawing Sheets

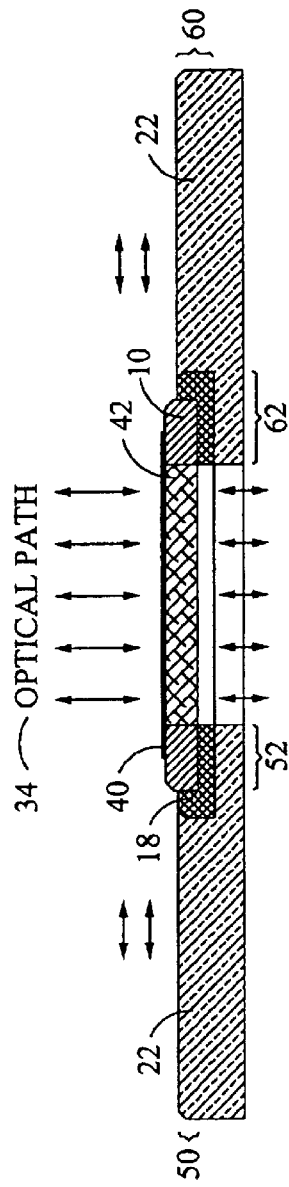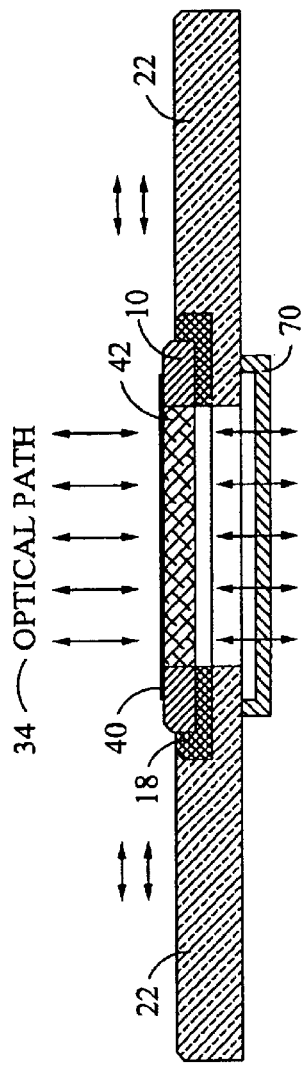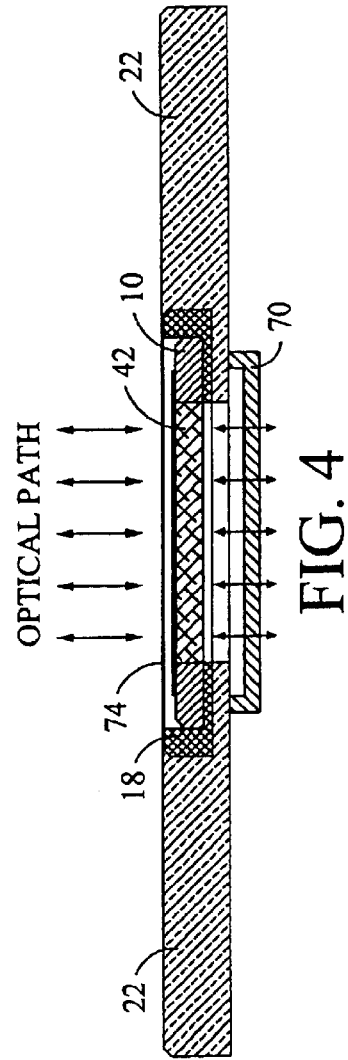

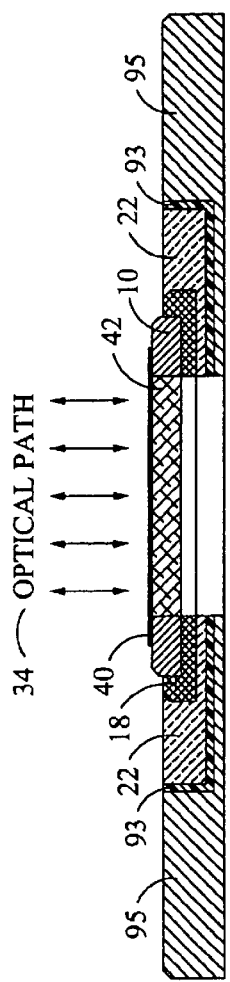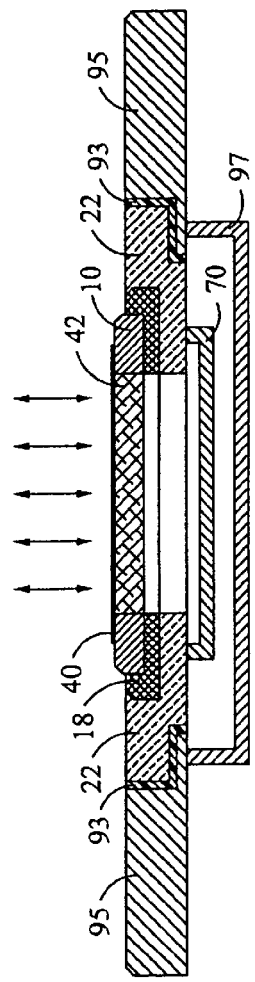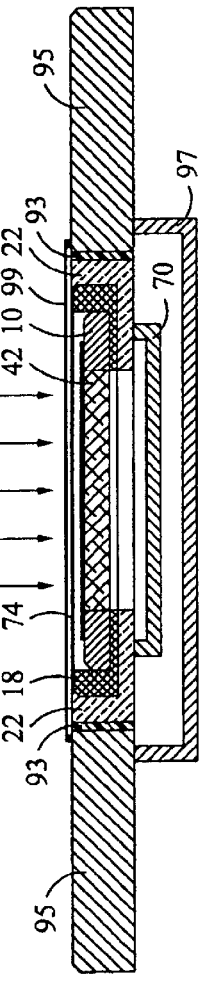

OPTICAL TESTING DEVICE

This application claims benefit of Ser. No. 60/316,644 filed Aug. 31, 2001.

BACKGROUND OF THE INVENTION

The present invention is directed to a chuck adapted to test electrical and/or optical components on a device-under-test (DUT).

Guarding systems suitable to reduce leakage currents during low current measurements are well known and discussed extensively in the technical literature. See, for example, an article by William Knauer entitled "Fixturing for Low Current/Low Voltage Parametric Testing" appearing in *Evaluation Engineering*, November, 1990, pages 150–153. Probe stations employing such a guarding system typically route a test signal to selected contact pads on the device-under-test (DUT) and route a guard signal to electrically conductive material surrounding the DUT on several sides, separated from the device-under-test by dielectric material (e.g., air). The guard signal preferably closely approximates the test signal or otherwise follows the test signal, thus reducing electromagnetic leakage currents that might otherwise occur.

Frequently, such probe stations also provide an electrically conductive enclosure around the perimeter of the probe station connected to a shield potential. The shield potential is typically connected to earth ground, instrumentation ground, or some other suitable potential. See, for example, Peters et al., U.S. Pat. No. 6,002,263.

To provide effective guarding and shielding for probe stations, a multistage chuck upon which the device-under-test rests during testing may likewise be used. The upper stage of the chuck, which supports the device-under-test, typically includes an electrically conductive metal layer through which the test signal may be routed. A middle stage and a lower stage of the chuck similarly include an electrically conductive metal layer to which a guard signal and a shield signal may be imposed, respectively. In this fashion, a device-under-test resting on such a multistage chuck may be both guarded and shielded from below. Some probe stations also provide for guarding from the sides and from above.

Many electrical devices, in particular semiconductor based devices, include both electrical components and optical components. Some optical components receive an optical signal from an optical source and convert the received optical signal into an electrical signal, e.g., a photo-detector. Other optical components convert an electrical signal into an optical signal, e.g., a light-emitting-diode. Yet other optical components may include multiple optical and/or electrical components. Frequently, a probe station may be used to test the electrical components.

Unfortunately, the aforementioned probe stations are not suitable for testing optical components because there is no optical path through the chuck itself. Accordingly, a different type of chuck, namely an optical chuck, is used for testing devices that include optical components. An optical chuck typically includes an central optically transparent medium over which the device-under-test is supported. For example, an optical signal from a light source may be directed toward the device-under-test from below, above, or to the side of the optical chuck, and a probe or connector used to sense the resulting electrical output from the device-under-test. Similarly for example, a probe or connector may be used to provide an electrical source to the device-under-test, and an optical sensing device located below, above, or to the side of the optical chuck to sense the resulting optical output from the device-under-test. Accordingly, the probe station is used to provide a shielded environment from exterior electromagnetic noise so that the input-output characteristics of an optical device-under-test may be performed. It may be observed that the testing of the optical components on the device-under-test is performed by observing the input and output characteristics of the device which normally have significant voltage and/or current levels (or optical power) making measurements easily performed.

BRIEF DESCRIPTION OF THE DRAWINGS

FIG. 2 is a cross sectional view of an optical chuck.

FIG. 3 is a cross sectional view of an alternative optical chuck.

FIG. 4 is a cross sectional view of yet another alternative optical chuck.

FIG. 6 is a cross sectional view of an optical chuck.

FIG. 7 is a cross sectional view of an alternative optical chuck.

FIG. 8 is a cross sectional view of yet another alternative optical chuck.

DETAILED DESCRIPTION OF THE PREFERRED EMBODIMENT

The traditional approach to optical testing involves testing the inputs and outputs of a device-under-test with an optical sensor(s), a connector(s), and/or an electrical probe(s). Based upon using the sensor, the connector, and/or electrical probe the overall operational characteristics of the device-under-test may be characterized. The present inventors came to the realization that together with optical testing there is a previously unrealized need to achieve performance levels that were previously not considered needed, namely ultra low noise and low current measurements. In particular, the present inventors determined that unlike measuring the operational inputs and/or outputs of the device-under-test which are sufficiently accurately measured using only a shielded environment because the noise levels are relatively low and the current levels are relatively high, measurements of other electrical characteristics of the device-under-test apart from the operational inputs and/or outputs are desirable. For example, low current measurements with a high degree of accuracy may be desirable of a portion of the electrical aspects of the optical device-under-test, such as the leakage currents of a junction for a light emitting diode.

Figure 1:
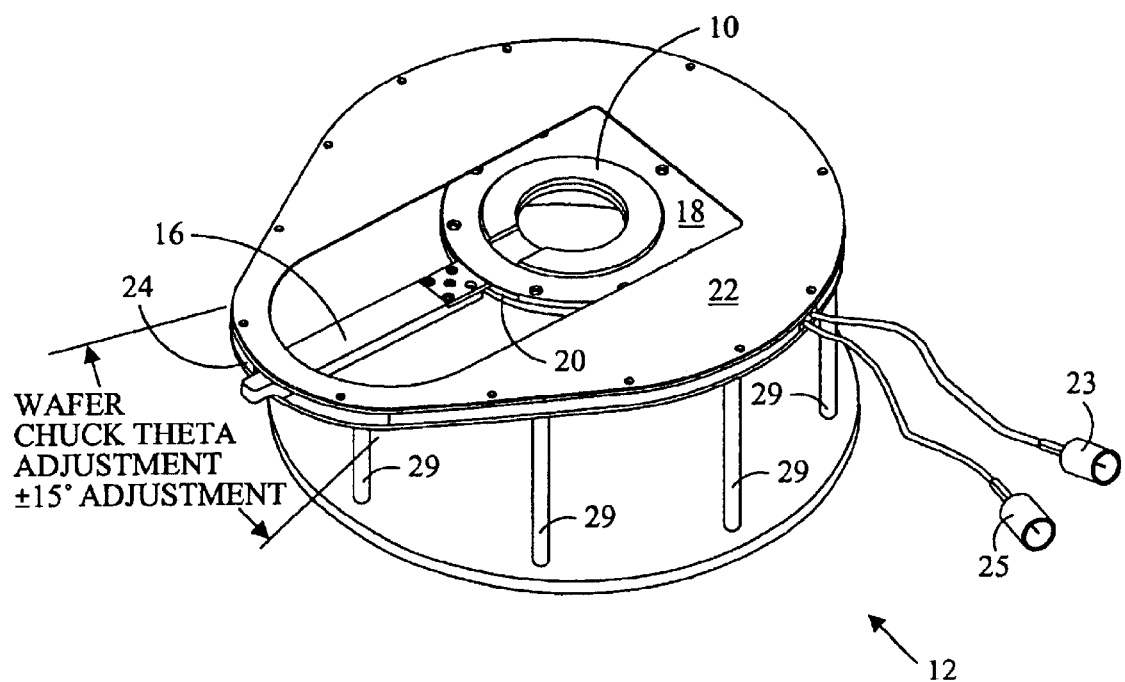
FIG. 1 is a perspective view of a portion of a wafer probe station having a chuck.

FIG. 1 illustrates a chuck 10 suitable for use with a support 12 within a probe station for testing a device-under-test. The perimeter region of the chuck 10 is preferably electrically conductive and is supported around its periphery by an insulating member 18. The insulating member 18 maintains the chuck 10 in a fixed elevational position with respect to each other. The insulating member 18 may include a handle 16 that passes through a slotted opening 20 to permit rotation of the chuck 10, and hence the device-under-test supported thereon, for alignment. The insulating member 18, and hence the chuck 10 supported thereon, are slidably engaged with a conductive member 22. The handle 16 may extend from a slot 24 beneath the conductive member 22. The handle 16 may be used to laterally move the chuck 10 for easier loading and unloading of a device-under test on the chuck 10. Preferably, the conductive member is at least partially laterally surrounding and/or at least laterally spaced apart from the chuck 10 and/or the insulating member 18. In addition to a connector 23, probes may be used to provide a test signal to the device under test or otherwise sense a signal from the device under test. An optical sensing device (not shown) may be included under the conductive member 22 within the region defined by the supports 29. Alternatively, the optical sensing device may be included above the conductive member 22 or to the side thereof. As shown in FIG. 1, the device-under-test may be tested in an environment that includes a guard potential proximate thereof by connecting the conductive member 22 to the guard potential, which permits effective testing at leakage current levels not previously obtainable, nor thought desirable, with existing optical probes. For example, the guarding of the optical chuck of FIG. 1 resulted in a reduction greater than several orders of magnitude in stray capacitance (force to shield).

The support 12 may include one or more connectors 23 to the chuck 10. The connector 23 is preferably a co-axial or tri-axial connector providing a force test signal to the device under test. Also, multiple connectors 23 may be used to provide a Kelvin connection and/or a quasi-Kelvin connection to the device-under-test. In addition, the support 12 may include one or more connectors 25 to provide a sense signal to the conductive member 22. The guard braid on the connector 23 and/or connector 25 may be electrically connected to the conductive member 22.

While the chuck 10 design facilitates improved testing of the device-under-test, at leakage current levels not previously considered obtainable, a tendency for breaking the device-under-test occurs when undergoing pressure as a result of probes. In addition, the device-under-test has a tendency to warp or otherwise become non-uniform as a result of the central region of the device-under-test not being supported. Referring to FIG. 2, the chuck 10 may further include a central region having an optically transmissive (e.g., transparent) material 42 to the wavelength used for testing. The optically transmissive material 42 is preferably co-planar (or substantially co-planar) with the chuck 10 supporting the device-under-test 40 so that the device-under-test is supported in face-to-face contact over at least a majority of its surface area. Also, the optically transmissive material 42 preferably occupies at least a majority of the lateral spatial extent of the opening (i.e., not the depth) defined by the chuck 10. With the optically transmissive material 42 in the optical path of the device-under-test light may readily pass through the opening in the chuck 10.

The insulating member 18 may include a raised portion 50 and an inset portion 52. The raised portion 50 forms a perimeter having an inner diameter substantially equal to the outer diameter of the chuck 10 which maintains the chuck 10 within the inset portion 52. The inset portion 52 preferably has an inner diameter substantially equal to the inner diameter of the chuck 10 so as to form a substantially continuous boundary for the optical path 34.

In a similar fashion, the conductive member 22 may include a raised portion 60 and an inset portion 62. The raised portion 60 provides a surface having an inner shape, such as a pair of co-planar surfaces, substantially equal to the exterior width of the raised portion 50 of the insulating member 18. In this manner, the insulating member 18 may be positioned within the conductive member 22. The inset portion 62 of the conductive member 22 has an inner diameter substantially equal to the inner diameter of the inset portion 52 and the chuck 10 so as to form a substantially continuous boundary for the optical path 34.

Devices within the optical path 34 may include materials that are optically transparent to the wavelength of the optical signal. A variety of commercially available materials are suitable for use as the optical chuck material 42, such as for example, quartz, sapphire, lithium niobate, and silicon.

After consideration of the support shown in FIG. 2, the present inventors came to the realization there exists a region which is substantially unguarded, namely, the region below the device under test. Initially it would seem that this region below the device-under-test will remain unguarded because placing a conductive member in the optical path would inhibit sensing the optical signal from the device or providing an optical signal to the device. After further consideration, the seemingly unavailability of a conductive member may be overcome by including an optically transmissive conductive material connected to a guard potential in the optical path below the device-under-test. Referring to FIG. 3, a lower optically transmissive conductive material 70 may be positioned in the optical path and electrically interconnected to the conductive member 22 to provide more complete guarding for the device-under-test, if desired. Alternatively, a non-conductive optically transparent material coated with an optically transparent material such as indium-tin-oxide, electrically interconnected to the conductive member 22 may be used.

After consideration of the supports shown in FIGS. 2 and 3, the present inventors came to the realization there exists a region which remains substantially unguarded, namely, the region above the device under test. Initially it would seem that this region above the device-under-test will remain unguarded because placing a conductive member in the optical path is seemingly difficult. After further consideration, the seemingly unavailability of a conductive member may be overcome by relocating the device-under-test and including an optically transmissive conductive material 74 in the optical path above the device-under-test, such as shown in FIG. 4. Alternatively, a non-conductive optically transparent material coated with an optically transparent material, such as indium-tin-oxide, electrically interconnected to the conductive member 22 may be used.

It is to be understood that the orientation of the device-under-test is shown with the device-under-test on the top with the chuck thereunder. It is to be understood that the testing may be performed with the orientation of the device-under-test and/or chuck (etc.) in an inverted orientation.

The preferred embodiment of the support 12 provides a wafer supporting surface capable of providing a test signal and a guard member 22 that, in conjunction with the lower guard member 70, allows the signal provided to or received from the device-under-test to be electrically guarded. The support 12 also provides an environment suitable for low current low leakage measurements for an optical device so that the device-under test need not be transferred between an optical chuck in an optical probe station and a traditional chuck in an electrical probe station for the testing of optical components and electrical components, respectively, that may be included within the device-under-test.

Generally speaking, chucks used to support a DUT during both electrical and optical testing needs to provide a stable surface where the DUT is held in place while testing is performed. In this regard, a number of chucks, appropriately called vacuum chucks, use vacuum pressure to hold the DUT in place. One problem with existing vacuum chucks is that when testing a DUT on a wafer that has been broken, the vacuum pressure provided by the chuck tends to deform the wafer because the chuck was only designed to hold a full wafer.

Figure 5:
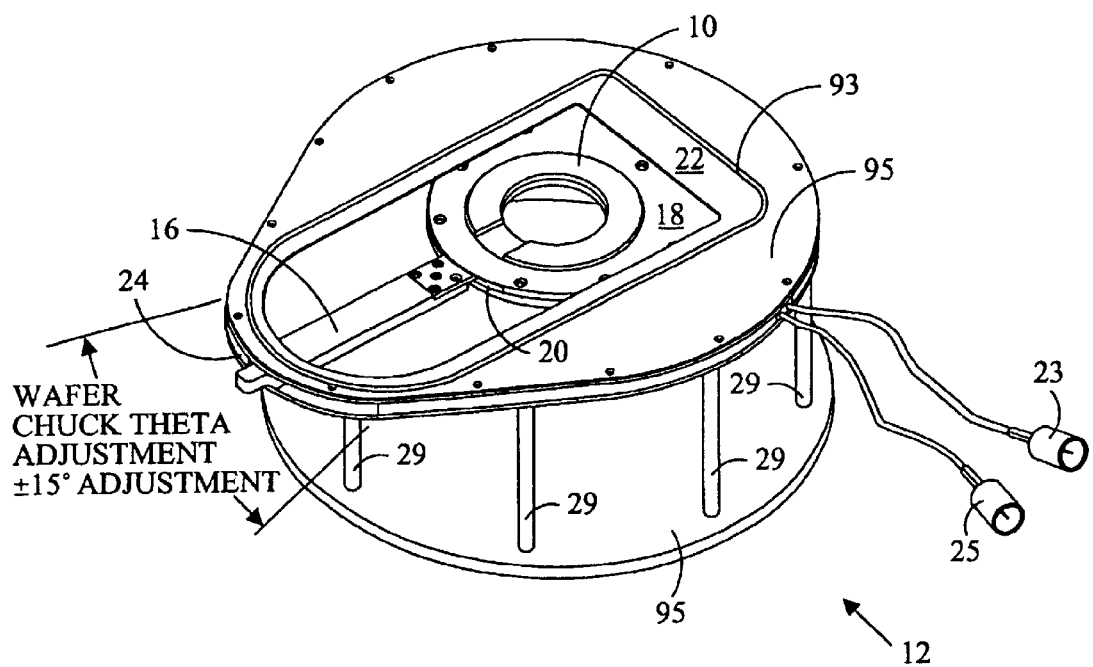
FIG. 5 is a perspective view of a portion of a wafer probe station having a chuck.

After further consideration the present inventors determined that further improvements in the measurement levels may be achieved by incorporating a shield potential within the support. Referring to FIG. 5, an additional insulator 93 may surround the conductive member 22. Around the perimeter of the additional insulator 93 is another conductive member 95. The conductive member 22 is preferably connected to a guard potential while the another conductive member 95 is connected to a shield potential. The shield potential may be provided in any suitable manner, such as for example, the shield braid of the connector 23 and/or the connector 25. Referring to FIG. 6, the another conductive member 95 may extend to the optical path 34. Referring to FIG. 7, the another conductive member 95 may be terminate prior to the optical path 34. Moreover, an optically transmissive conducive material or non-conductive optically transmissive material with a conductive coating, generally referred to as material 97, may be provided within the optical path and connected to shield. Referring FIG. 8, yet another conductive member 95 may be terminate prior to the optical path 34. Moreover, an optically transmissive conducive material or non-conductive optically transmissive material with a conductive coating, generally referred to as material 99, may be provided within the optical path and connected to shield. As it may be observed, the guard and/or shield environment may be extended in a lateral direction, and the guard and/or shield environment may be extended in a vertical direction, as desired.

Figure 9:
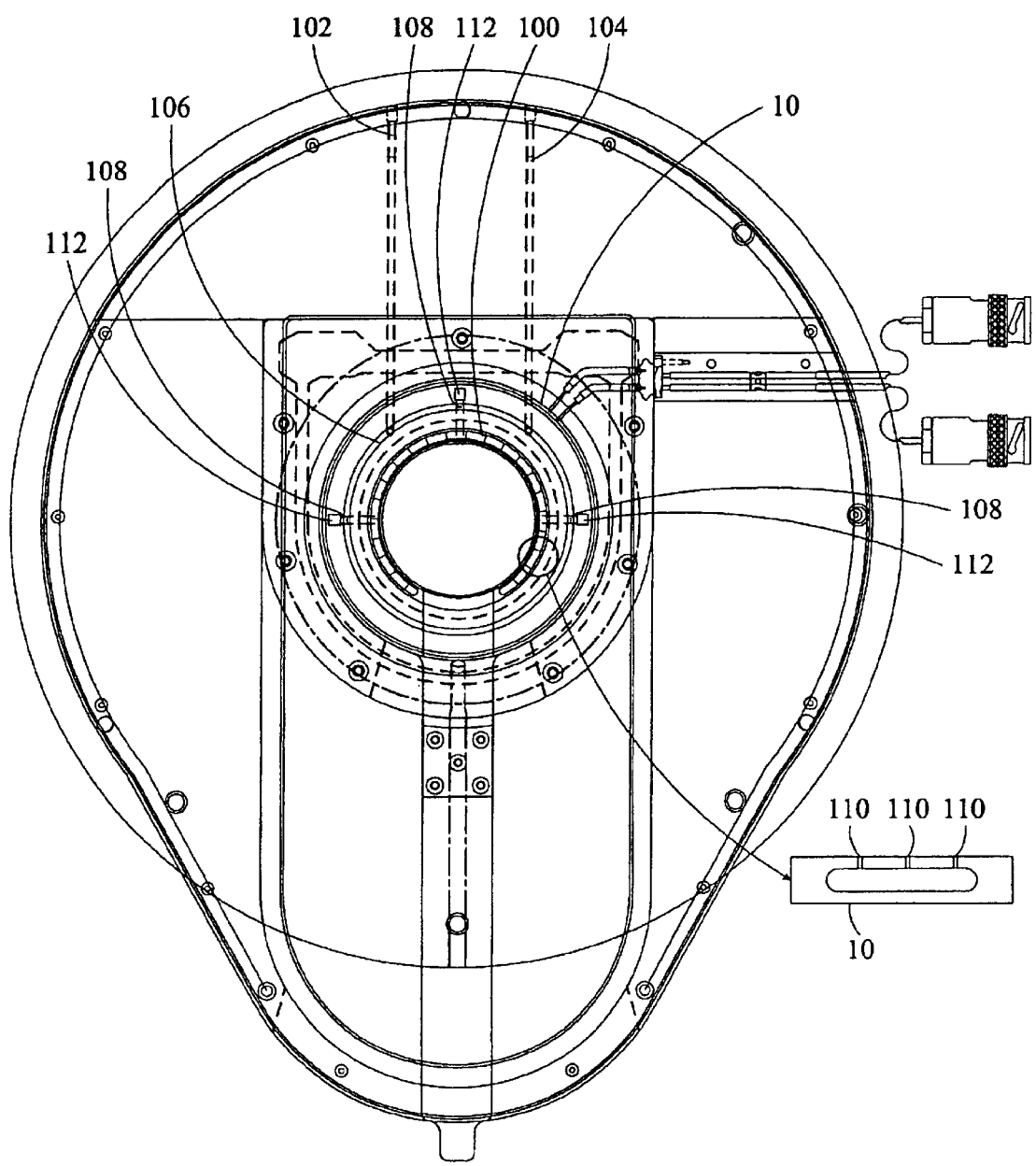
FIG. 9 is a top view of the wafer probe station shown in FIG. 1 illustrating a selective vacuum positioning system.

Referring to FIG. 9, the chuck 10 may include a vacuum chamber 100 comprising an approximate ring of about 270 degrees around the midpoint of the chuck 10. The vacuum chamber 100 may encircle the entire chuck or less than 270 degrees, as desired. A vacuum source (not shown) operates to provide a vacuum and is operatively connected to the vacuum chamber through vacuum supply lines 102 and 104, a vacuum supply chamber 106, and three vacuum shafts 108. Vacuum pressure present within the vacuum chamber 108 is transmitted to the surface of the chuck 10 through small apertures 110.

The vacuum shafts 108 (or otherwise a passage or chamber) are preferably positioned at 0 degrees, 90 degrees, and 270 degrees around the vacuum chamber 100, respectively. A plug 112 each vacuum shaft, respectively, may be used to selectively isolate portions of the vacuum chamber 100 from the vacuum source. For example, if the vacuum source supplies vacuum pressure through vacuum supply line 104, and the plugs 112 associated with the vacuum shafts 108 at 0 and 90 degrees respectively are activated, then a quarter section of the chuck is providing vacuum pressure to the wafer. Similarly, if the vacuum member is supplying vacuum pressure through either vacuum supply line 102 or vacuum supply line 104, or both, and the plugs 112 at 90 degrees and 270 degrees, respectively, are activated, then a half-section of the chuck is providing vacuum pressure to the wafer. The selective activation of different regions of the vacuum chamber of the chuck in non-concentric rings permits fragments of a semiconductor device to be effectively tested. For example, if a fragment of a semiconductor is available then one or more regions may be interconnected to the vacuum source to maintain the fragment properly positioned on the chuck 10. By disabling the vacuum for the non-used portions of the chuck the vacuum pressure may be more readily controlled and improves the vacuum by reducing leaks. Moreover, if a significant number of small apertures 110 are not covered with a respective device-under-test then the resulting vacuum pressure for the small apertures 110 under the device-under-test may not sufficient vacuum pressure to maintain sufficient pressure. It is to be understood that other patterns of vacuum holes may likewise be used where groups of one or more vacuum holes may be selectively enabled. Also, the different regions may include at least one of the same holes, if desired. The patterns of the vacuum holes preferably include at least one selectable region that is in a non-concentric region. Also, a switching mechanism may be used to select which of the vacuum regions provide a vacuum to the surface of the chuck. In addition, a selectable vacuum source may be provided to each vacuum region.

Figure 10:
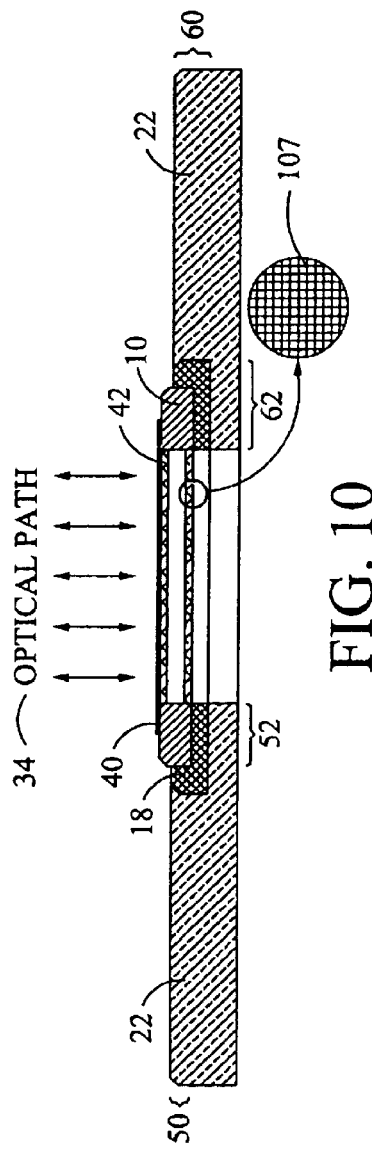
FIG. 10 is a cross sectional view of an optical chuck.
Figure 11:
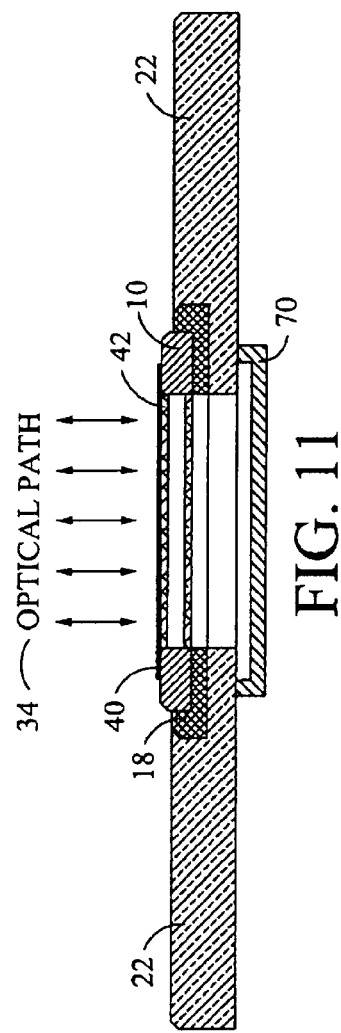
FIG. 11 is a cross sectional view of an alternative optical chuck.
Figure 12:
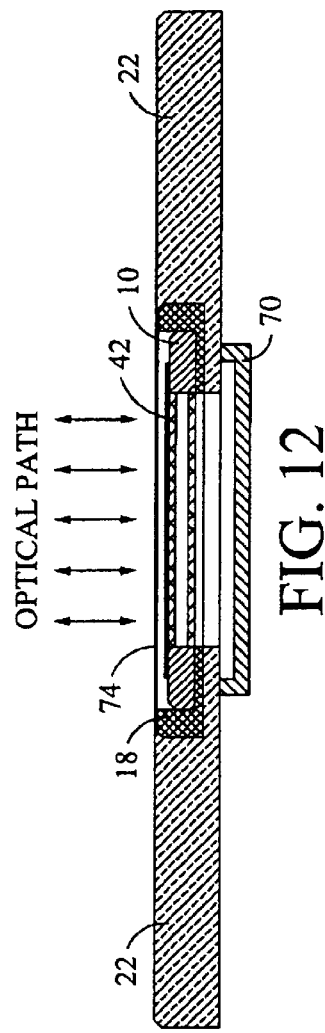
FIG. 12 is a cross sectional view of yet another alternative optical chuck.

After further consideration of the planarity of the device-under-test it is preferable to include vacuum holes within the optically transmissive material. Accordingly, a pair of spaced apart transmissive plates with an opening defined therein to which a vacuum is provided may be used with holes in the upper plate to provide a vacuum to the upper surface. However, using sufficiently thick spaced apart glass plates to provide structural integrity to the wafer results in excessive refraction of the optical signal. Also, using sufficiently thin spaced apart glass plates results in deflection of the supporting glass, and thus the wafer, which distorts the measurements. Referring to FIGS. 10, 11, and 12, to overcome this limitation a pair of optically transmissive plates preferably include a web material, such as a honeycomb pattern, between the two plates to provide structural support. Preferably the web material extends between and interconnects the two plates to provide structural support. The web material may be in any suitable pattern, such as for example, a grid pattern or stripes. In addition, the web material may likewise provide selective vacuum zones to the upper surface.

All references cited herein are incorporated by reference.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A test assembly comprising: (a) a chuck for supporting a device under test; (b) said chuck defining an optical path that is transmissive to an optical signal; and (c) a conductive member at least partially laterally spaced apart from said chuck connected to a guard potential.

2. The assembly of claim 1 wherein said chuck has a conductive surface in face-to-face abutment with said device under test when said device-under-test is supported thereon.

3. The assembly of claim 1 wherein said chuck has a planar upper surface for supporting said device-under-test.

4. The assembly of claim 1 wherein said chuck defines a substantially circular optical path there through.

5. The assembly of claim 1 wherein said optical signal originates from said device-under-test.

6. The assembly of claim 1 wherein said optical signal originates at a location spaced apart from said device-under-test.

7. The assembly of claim 1 wherein said conductive member is at least partially laterally surrounding said chuck.

8. The assembly of claim 1 wherein said chuck and said conductive member are spaced apart from each other.

9. The assembly of claim 8 further comprising an insulating member located between said chuck and said conductive member.

10. The assembly of claim 1 wherein said optical path includes an optically transmissive material through which said optical signal passes.

11. The assembly of claim 10 wherein said optically transmissive material includes a conductive coating electrically connected to said guard potential.

12. The assembly of claim 11 wherein said conductive coating is located below said device-under-test.

13. The assembly of claim 10 wherein the combination of said optically transmissive material and said chuck support said device-under-test over a majority of the surface area of said device-under-test when said device-under-test is supported thereon.

14. The assembly of claim 1 wherein said conductive member laterally surrounds a majority of said chuck.

15. The assembly of claim 1 wherein said device-under-test is maintained on said chuck by a vacuum.

16. A test assembly comprising: (a) a chuck for supporting a device under test; (b) said chuck defining an optical path that is transmissive to an optical signal; and (c) a conductive member positioned at least partially within said optical path wherein said optical signal passes through at least a portion of said conductive member, wherein said conductive member is connected to a guard potential.

17. The assembly of claim 16 wherein said conductive member is located below the device-under-test.

18. The assembly of claim 16 wherein said chuck has a conductive surface in face-to-face abutment with said device under test when said device-under-test is supported thereon.

19. The assembly of claim 16 wherein said chuck has a planar upper surface for supporting said device-under-test.

20. The assembly of claim 16 wherein said chuck defines a substantially circular optical path there through.

21. The assembly of claim 16 wherein said optical signal originates from said device-under-test.

22. The assembly of claim 16 wherein said optical signal originates at a location spaced apart from said device-under-test.

23. The assembly of claim 16 wherein said chuck and said conductive member are spaced apart from each other.

24. The assembly of claim 16 wherein said device-under-test is maintained on said chuck by a vacuum.

* * * * *